United States Patent
Hwang

(10) Patent No.: US 6,256,825 B1
(45) Date of Patent: *Jul. 10, 2001

(54) REMOVAL OF PARTICULATE CONTAMINATION IN LOADLOCKS

(75) Inventor: Yuan-Ko Hwang, Hualien Hsien (TW)

(73) Assignee: Taiwan Semiconductor Manufacturing Company, Hsin-chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/196,752

(22) Filed: Nov. 20, 1998

Related U.S. Application Data

(62) Division of application No. 08/679,913, filed on Jul. 15, 1996, now Pat. No. 5,858,108.

(51) Int. Cl.$^7$ ................................. B08B 6/00; B44C 1/22
(52) U.S. Cl. ............................... 15/1.51; 134/1; 134/1.3; 134/21; 134/34; 134/37; 134/902; 438/906; 361/212
(58) Field of Search ................................ 15/1.51; 216/37, 216/67; 438/710, 906; 134/1, 1.3, 21, 34, 37, 2, 902; 204/298.31, 298.35–298.38; 219/121.44, 121.43; 361/212; 156/345

(56) References Cited

U.S. PATENT DOCUMENTS

| | | | |
|---|---|---|---|
| 4,951,601 | * 8/1990 | Maydan et al. | 118/719 |
| 5,202,008 | * 4/1993 | Talieh et al. | 204/298.11 |
| 5,240,046 | * 8/1993 | Mack | 137/14 |
| 5,298,720 | | 3/1994 | Cuomo et al. | 219/121.43 |
| 5,350,428 | * 9/1994 | Leroux et al. | 15/1.51 |
| 5,410,122 | | 4/1995 | Su et al. | 219/121.44 |
| 5,516,369 | * 5/1996 | Lur et al. | 15/1.51 |
| 5,573,597 | * 11/1996 | Lantsman | 156/345 |
| 5,584,938 | * 12/1996 | Douglas | 15/1.51 |
| 5,770,000 | * 6/1998 | Zinman et al. | 156/345 |

FOREIGN PATENT DOCUMENTS

3904969 * 9/1989 (DE).
161598 * 6/1995 (JP).

OTHER PUBLICATIONS

"Particles on Surfaces 1" Cooper et al. pp. 339–349, 1988.*
Strasser et al, "Reduction of Particles Contamination By Controlled Venting and Pumping of Vacuum Loadlocks", Vac. Sci. Technol. A vol. 8, No. 6, pp. 4092–4097, Nov. 1990.*
Seto et al, "Fine Particulate Contaminant Control by the w/Photoelectron Method Under a Low Pressure Condition", Nov. 1995.*
Rev. Sci. Instrum, vol. 66, No. 11, pp. 5348–5351.*

* cited by examiner

Primary Examiner—Gary K. Graham
(74) Attorney, Agent, or Firm—George O. Saile; Stephen B. Ackerman

(57) ABSTRACT

The invention teaches the removal of dust particles during semiconductor processing without the need to modify the processing chambers or to wait until they are not being used for their normal purposes. The dust removal operation is performed inside loadlocks instead the processing chambers. Dust removal, in a loadlock, is accomplished by first initiating a flow of gas over the wafer surface. Then a negative charge is induced at the surface for a period of time followed by the induction of a positive charge. This causes the charged particles to be repelled away from the surface, at which point they are swept away by the gas. To remove the electrically neutral dust particles, the induced surface charge is switched too rapidly for these particles to follow, so they are briefly repelled from the surface and then swept away by the gas.

4 Claims, 4 Drawing Sheets

REMOVAL OF PARTICULATE CONTAMINATION IN LOADLOCKS

This is a division of patent application Ser. No. 08/679,913, filing date Jul. 15, 1996, now U.S. Pat. No. 5,858,108, Removal Of Particulate Contamination In Loadlocks, assigned to the same assignee as the present invention.

BACKGROUND OF THE INVENTION (1) Field of the Invention

The invention relates to the field of dust removal during semiconductor processing, more particularly to dust removal in loadlocks.

(2) Description of the Prior Art

The rapid development of the integrated circuit art, particularly the ability to form, with high process yield, many circuits on a single semiconductor wafer, has been due in part to the development of methods for controlling the levels of particulate contamination at all stages of the manufacturing process. While great pains are taken to ensure that no dust enters the process from outside the various processing chambers that are used, there still remains a problem with dust generated within these processing chambers themselves.

Particular attention has been paid in the prior art to dust that is generated as a byproduct of plasma processes. Dust particles, in general, are likely to carry an electrical charge, as witness the effectiveness of electrostatic precipitators. In addition, in a plasma environment, the opportunities for dust particles to acquire charges are even greater. This increases the likelihood that the dust particles will adhere to various exposed surfaces, including the surfaces of semiconductor wafers that are undergoing processing within the plasma environment.

Thus, several patents reflect the development, in the prior art, of methods for removing particulate contamination from semiconductor surfaces in a plasma environment. For example, Cuomo et al. (U.S. Pat. No. 5,298,720 March 1994) teach the design of electrode surfaces in a plasma apparatus to include grooves or tapers in which contaminating particles are preferentially trapped. Su et al. (U.S. Pat. No. 5,410,122 April 1995) remove particles that adhere to a semiconductor surface by inducing electric charges on this surface, to repel the particles away from the surface, and then removing the repelled particles by the application of a force parallel to the surface, such as by flowing gas across the surface.

A major limitation of these, and similar, patents is that they are restricted to the removal of dust resulting from plasma processes. Furthermore, the removal of the dust is performed in the plasma processing chamber itself. This means that modifications have to be made to the processing apparatus thereby introducing the possibility of reducing the efficiency of the process as presently practiced and/or as might be practiced in some new and improved manner in the future.

In the present invention, removal of the dust particles is not performed in the processing chamber, but in the loadlock that feeds or unloads the processing chamber. Such loadlocks are widely used as a buffer between the processing chamber and the atmosphere or another (different) processing chamber. Thus the present invention is not restricted to plasma processes nor is any modification of any processing apparatus required.

SUMMARY OF THE INVENTION

It has been an object of the present invention to provide apparatus and method for removing dust particles during semiconductor processing without having to modify any of the chambers used for such processing.

Another object of the present invention is that such dust removal be possible at a time when the processing chambers are being used, prepared or otherwise engaged.

These objects have been achieved by performing the dust removal function inside loadlocks instead the processing chambers. Dust removal, in a loadlock, is accomplished by first initiating a flow of gas over the wafer surface. Then a negative charge is induced at the surface for a period of time followed by the induction of a positive charge. This causes the charged particles to be repelled away from the surface, at which point they are swept away by the gas. To remove the electrically neutral dust particles, the induced surface charge is switched too rapidly for these particles to follow, so they are briefly repelled from the surface and then swept away by the gas.

DESCRIPTION OF THE PREFERRED EMBODIMENTS

Figure 1:
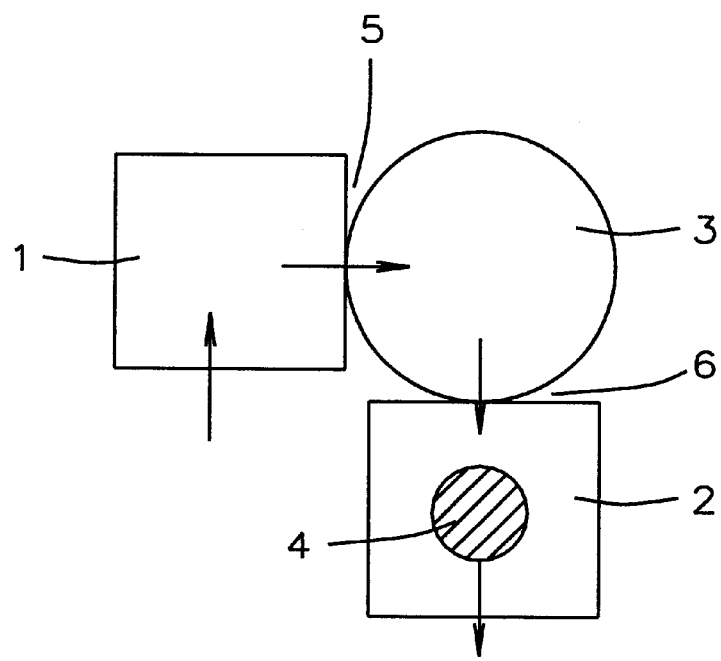
FIGS. 1 and 2 show different arrangements of loadlocks in relation to processing chambers.
Figure 2:
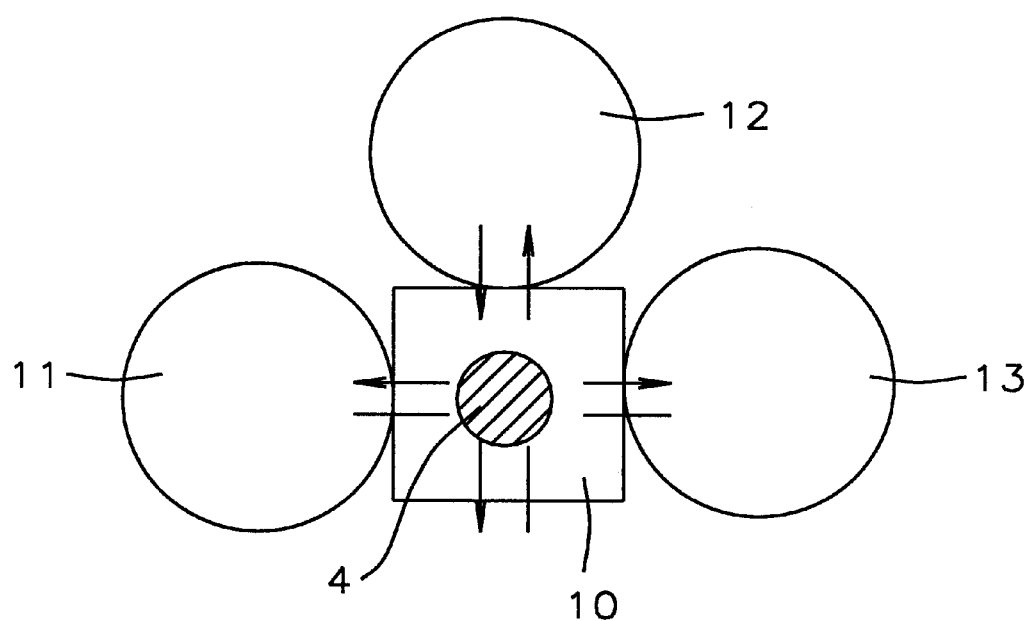

Referring now to FIGS. 1 and 2, we show there two schematic views of the use of loadlocks during semiconductor wafer processing. In FIG. 1 semiconductor wafer 4 is first placed in loadlock 1 which is then sealed, following which the gaseous atmosphere in loadlock 1 is adjusted to be the same as that in process chamber 3. Seal 5 between loadlock 1 and process chamber 3 is then opened and semiconductor wafer 4 is moved into chamber 3. Once processing has been completed in chamber 3, the atmosphere in loadlock 2 is adjusted to be the same as that in chamber 3, the intervening seal 6 is opened, and wafer 4 is moved into loadlock 2. Loadlock 2 is then evacuated following which atmosphere is admitted into it and wafer 4 is removed.

FIG. 2 illustrates an arrangement wherein a single loadlock (marked 10) is used to service several process chambers (11, 12, and 13). The present invention may be applied to either configuration. In either case, dust is removed inside a loadlock and not inside a process chamber, removing the necessity to modify any of the process chambers in any way. Additionally, time is saved in the overall production schedule since dust removal can proceed inside a loadlock while a process chamber is being prepared for its next operation.

Figure 3:
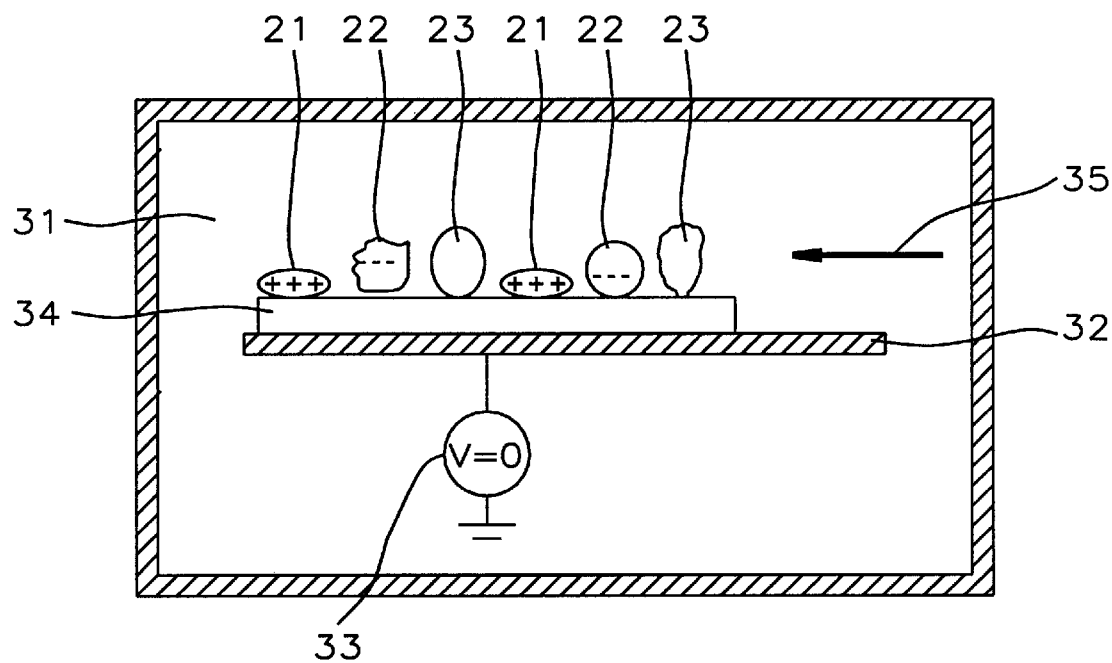
FIG. 3 is schematic view of a loadlock as modified in accordance with the present invention.

Referring now to FIG. 3, a typical embodiment of the present invention is schematically illustrated. Loadlock 31 is shown with semiconductor wafer 34 already inside it. Wafer 34 rests on support 32 which is electrically isolated from other parts of the loadlock, including the walls which are at ground potential. Voltage source 33 has been inserted between holder 32 and ground and is currently set to zero. A number of dust particles, their sizes greatly exaggerated for illustrative purposes, are shown resting on the top surface of wafer 34. As a result of prior processes the particles may be positively charged, such as particles 21, negatively charged, such as particles 22, or uncharged, such as particles 23.

Voltage source 33 represents means for inducing either a positive or a negative charge at the upper surface of wafer 34. A gas control valve (not shown) admits a gas such as argon, nitrogen, or helium into the loadlock causing it to flow across the surface of 34, as symbolized by arrow 35. While the gas is being admitted at one end of the load lock it is being pumped out at the other end (not explicitly shown) so that a steady flow is maintained. The gas pressure is between 5 and 20 torr.

Figure 4:
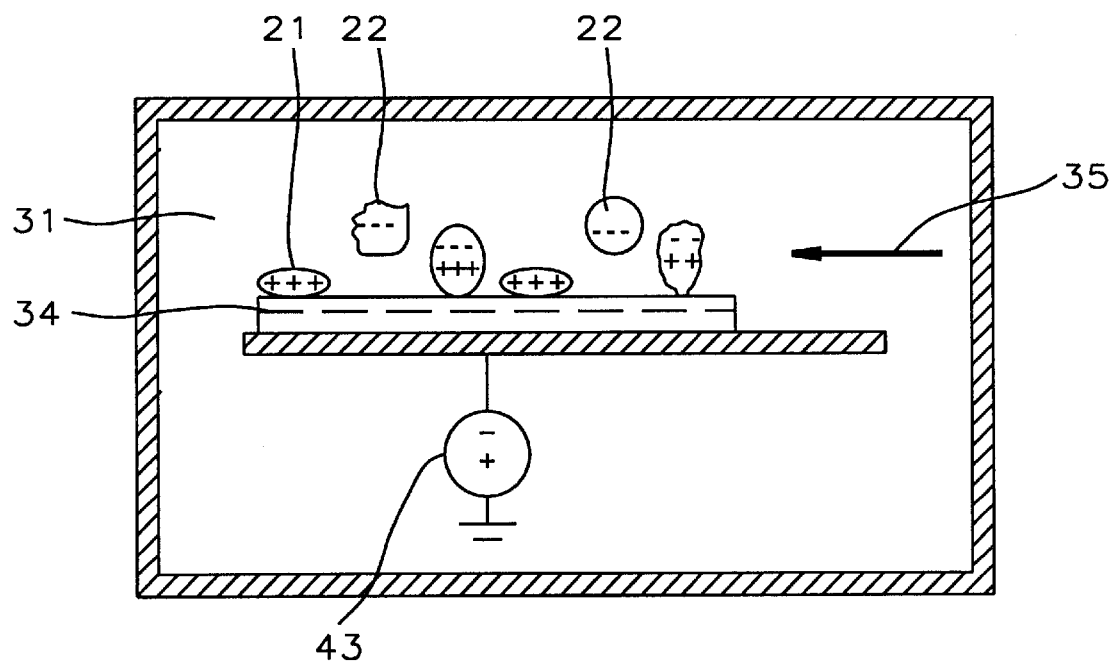
FIGS. 4, 5, and 6 illustrate successive steps for removing dust particles in accordance with the present invention.

To illustrate the procedure that is used with the apparatus shown in FIG. 3, we refer now to FIG. 4. Gas flow, at a rate of between about 500 and 4,000 SCCM and symbolized by arrow 35 is initiated. Then a negative charge is induced at the surface of 34 by means of negatively biassed power supply 43. This negative bias, which is generally between about 100 and 500 volts, is maintained for a period of time between about 0.5 and 5 seconds and results in the repulsion of negatively charged particles 22 away from the surface of wafer 34. Gas flow 35 then causes these particle to be swept away and out of the loadlock.

Figure 5:
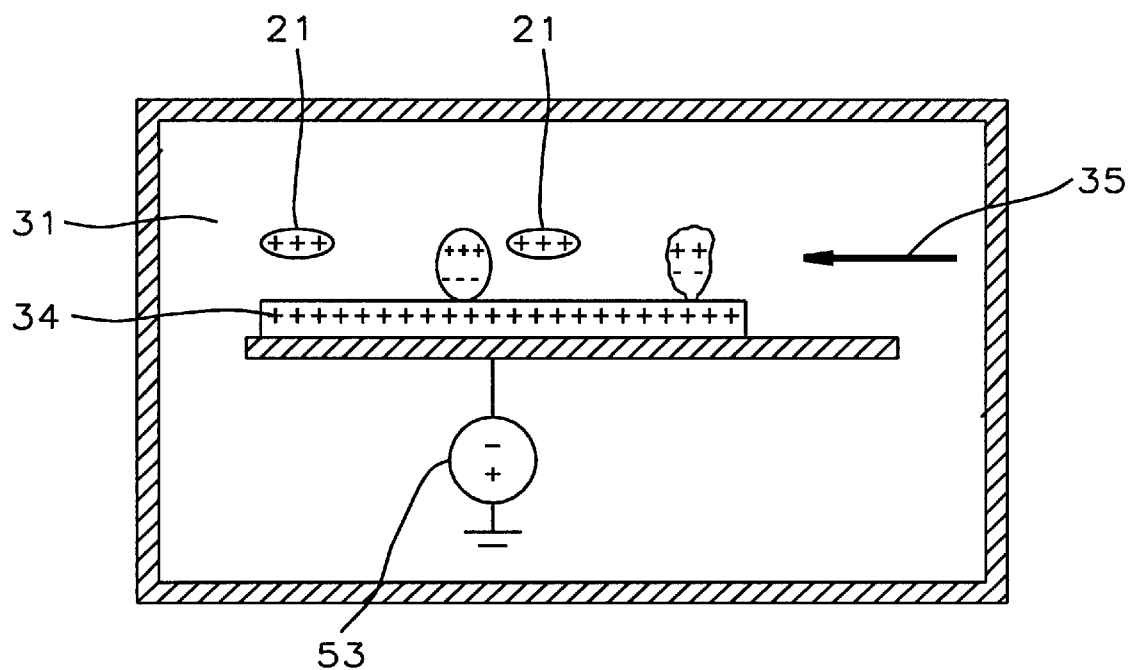

Referring now to FIG. 5, gas flow, as symbolized by arrow 35, continues to be maintained. Then a positive charge, between about 100 and 500 volts, is induced at the surface 34 by means of positively biassed power supply 53. This positive bias is maintained for a period of time between about 0.5 and 5 seconds and results in the repulsion of positively charged particles 21 away from the surface of wafer 34. Gas flow 35 then causes these particle to be swept away and out of the loadlock.

Figure 6:
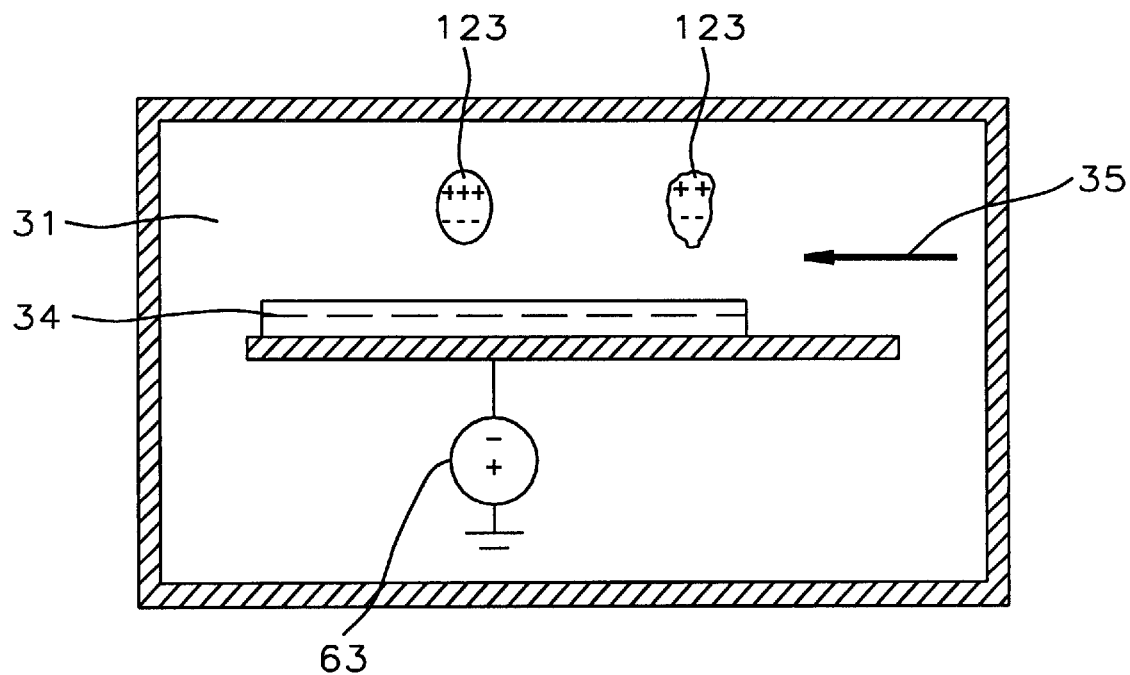

Referring now to FIG. 6, the gas flow, symbolized by arrow 35, continues. The positive charge that was induced at the surface of 34 is still in place and the positively charged particles, such as 21, have been removed, as decribed above. Neutral particles such as 123 still remain on the surface but have been converted to temporary electric dipoles, negatively charged at the ends facing wafer 34 and positively charged at the ends facing away from 34. Power supply 63 now rapidly reverses its bias so that a negative charge is induced at the surface of 34 in a period that is less than about 0.1 milliseconds. Because of slow relaxation times, the particles 123 do not switch polarity as quickly as does the power supply so for a brief period of time (typically a few milliseconds) particles 123 present a negative surface towards negatively charged wafer 34 and so are repelled away from the surface of 34. Gas flow 35 then causes these particle to be swept away and out of the loadlock. The above sequence may then be repeated 1 to 4 more times to make sure that all uncharged particles get removed.

At this point, gas flow 35 is terminated and the power supply is turned off. Then the loadlock is pumped out until a vacuum level less than about 0.1 torr is achieved. Atmospheric air is admitted into the loadlock and the wafer is removed from the loadlock.

Figure 7:
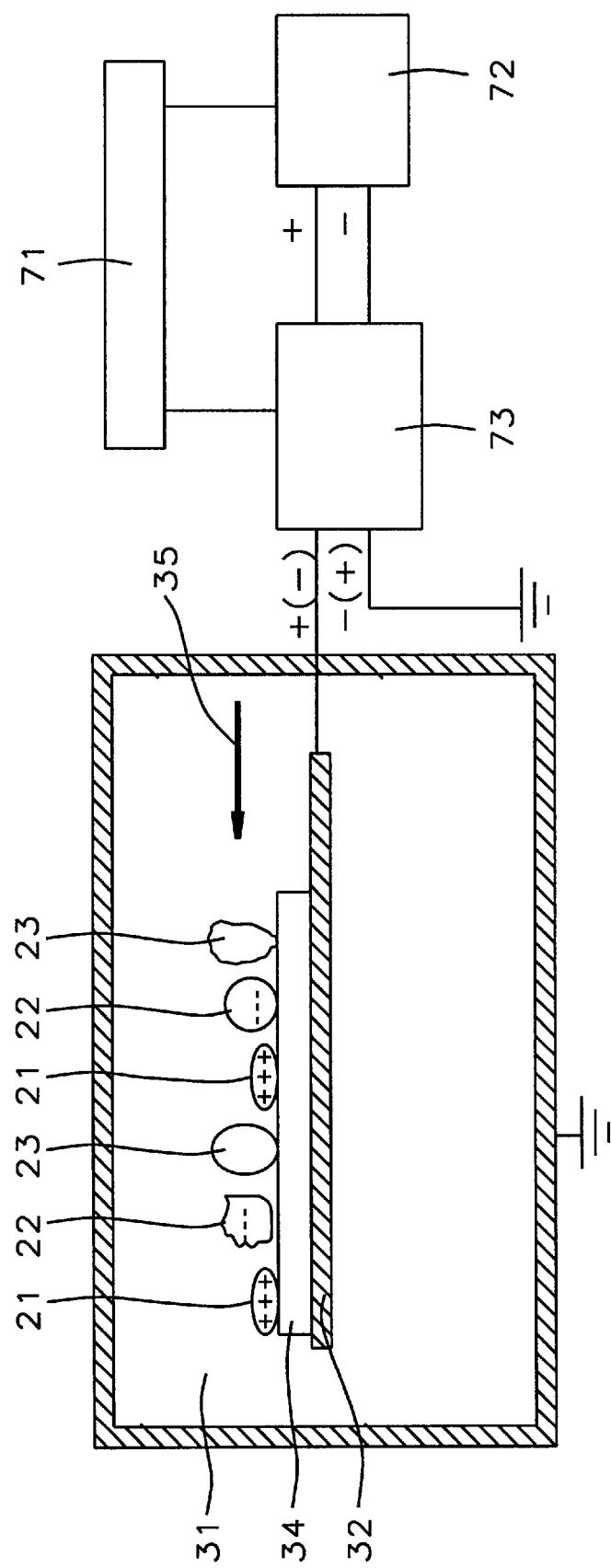
FIG. 7 gives detail of how voltage is applied to the surface that is to be cleaned.

Further detail concerning the application of the various biases to the wafer is shown in FIG. 7. Voltage from DC power supply 72 passes through polarity switch circuit 73. One output of 73 is grounded while the other output is connected to holder 32 which supports (and is electrically connected to) wafer 34. The choice of polarity, duration, and magnitude of the voltage at 32 is then determined by computer 71, running a preset program.

While the invention has been particularly shown and described with reference to the preferred embodiments thereof, it will be understood by those skilled in the art that various changes in form and details may be made without departing from spirit and scope of the invention.

What is claimed is:

1. An apparatus for removing dust particles from a semiconductor wafer having an upper surface, consisting of:

a loadlock;

means for applying a positive charge to said upper surface while the wafer is inside said loadlock;

means for applying a negative charge to said upper surface while the wafer is inside said loadlock; and means for causing a gas to flow across said upper surface, at a pressure between about 5 and 20 torr, while the wafer is inside the loadlock.

2. The apparatus of claim 1 wherein said means for applying a positive charge further comprises a DC power supply directly connected to the wafer through a computer controlled polarity switch circuit.

3. The apparatus of claim 1 wherein said means for applying a negative charge further comprises a DC power supply directly connected to the wafer through a computer controlled polarity switch circuit whereby said switch may have its polarity reversed within less than about 0.1 milliseconds.

4. The apparatus of claim 1 wherein said gas is taken from the group consisting of argon, nitrogen, and helium.

* * * * *